US008637945B2

(12) United States Patent
Reichenbach et al.

(10) Patent No.: US 8,637,945 B2
(45) Date of Patent: Jan. 28, 2014

(54) COMPONENT HAVING A MICROMECHANICAL MICROPHONE STRUCTURE, AND METHOD FOR ITS PRODUCTION

(75) Inventors: Frank Reichenbach, Wannweil (DE); Thomas Buck, Pittsburgh, PA (US); Jochen Zoellin, Stuttgart (DE); Franz Laermer, Weil Der Stadt (DE); Ulrike Scholz, Korntal (DE); Kathrin van Teeffelen, Stuttgart (DE); Christina Leinenbach, Karlsruhe (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 13/259,570

(22) PCT Filed: Apr. 7, 2010

(86) PCT No.: PCT/EP2010/054583

§ 371 (c)(1),
(2), (4) Date: Dec. 6, 2011

(87) PCT Pub. No.: WO2010/139498

PCT Pub. Date: Dec. 9, 2010

(65) Prior Publication Data

US 2012/0091544 A1 Apr. 19, 2012

(30) Foreign Application Priority Data

Jun. 3, 2009 (DE) ......................... 10 2009 026 682

(51) Int. Cl.
*H01L 29/84* (2006.01)

(52) U.S. Cl.
USPC .................... 257/416; 257/783; 257/E21.002; 257/E29.324; 257/E21.258; 438/736; 428/447; 156/184; 522/173; 310/334; 367/181; 381/174

(58) Field of Classification Search
USPC .................... 438/736; 156/184; 257/416, 783; 381/174; 367/181; 379/433.08; 310/334
See application file for complete search history.

(56) References Cited

U.S. PATENT DOCUMENTS 5,579,388 A * 11/1996 Endroes et al. .......... 379/433.08
5,982,041 A * 11/1999 Mitani et al. .................. 257/783

(Continued)

FOREIGN PATENT DOCUMENTS

DE 102004011145 10/2005
DE 10 2007029911 1/2009

(Continued)

OTHER PUBLICATIONS

International Search Report, PCT International Application No. PCT/EP2010/054583, dated Jul. 21, 2010.

*Primary Examiner* — Jerome Jackson, Jr.
*Assistant Examiner* — Bo Fan
(74) *Attorney, Agent, or Firm* — Kenyon & Kenyon LLP

(57) ABSTRACT

A component having a robust, but acoustically sensitive microphone structure is provided and a simple and cost-effective method for its production. This microphone structure includes an acoustically active diaphragm, which functions as deflectable electrode of a microphone capacitor, a stationary, acoustically permeable counter element, which functions as counter electrode of the microphone capacitor, and an arrangement for detecting and analyzing the capacitance changes of the microphone capacitor. The diaphragm is realized in a diaphragm layer above the semiconductor substrate of the component and covers a sound opening in the substrate rear. The counter element is developed in a further layer above the diaphragm. This further layer generally extends across the entire component surface and compensates level differences, so that the entire component surface is largely planar according to this additional layer. This allows a foil to be applied on the layer configuration of the microphone structures exposed in the wafer composite, which makes it possible to dice up the components in a standard sawing process.

11 Claims, 10 Drawing Sheets

(56) References Cited

U.S. PATENT DOCUMENTS

| | | | | |
|---|---|---|---|---|
| 2002/0067663 | A1 * | 6/2002 | Loeppert et al. | 367/181 |
| 2004/0026382 | A1 * | 2/2004 | Richerzhagen | 219/121.6 |
| 2004/0100163 | A1 * | 5/2004 | Baumgartner et al. | 310/334 |
| 2005/0187311 | A1 * | 8/2005 | Nakamura | 522/173 |
| 2007/0085452 | A1 * | 4/2007 | Coleman | 310/334 |
| 2007/0254490 | A1 * | 11/2007 | Jain | 438/736 |
| 2008/0156421 | A1 * | 7/2008 | Lee et al. | 156/184 |
| 2008/0175417 | A1 * | 7/2008 | Kok et al. | 381/174 |
| 2009/0026561 | A1 * | 1/2009 | Reichenbach et al. | 257/416 |
| 2010/0135123 | A1 | 6/2010 | Fischer et al. | |

FOREIGN PATENT DOCUMENTS

| | | | |
|---|---|---|---|
| JP | 08230093 | A * | 9/1996 |
| JP | 2000-223446 | | 8/2000 |
| JP | 2005-326310 | | 11/2005 |
| JP | 2007-104641 | | 4/2007 |
| JP | 2007-116721 | | 5/2007 |
| JP | 2007-208548 | | 8/2007 |
| JP | 2008-11154 | | 1/2008 |
| WO | WO 2009/037456 | | 3/2009 |

* cited by examiner

COMPONENT HAVING A MICROMECHANICAL MICROPHONE STRUCTURE, AND METHOD FOR ITS PRODUCTION

BACKGROUND INFORMATION

The present invention relates to a component having a micromechanical microphone structure. The microphone structure includes an acoustically active diaphragm, which functions as deflectable electrode of a microphone capacitor, a stationary, acoustically permeable counter element, which functions as counter electrode of the microphone capacitor, and means for detecting and analyzing the capacitance changes of the microphone capacitor. The diaphragm is realized in a diaphragm layer above the semiconductor substrate of the component and spans a sound opening in the substrate rear. The counter element is developed in an additional layer above the diaphragm.

Furthermore, the present invention relates to a method for producing such components in the wafer composite and subsequent dice-up operation.

U.S. Patent Application Publication No. 2002/0067663 A1 describes a microphone component whose micromechanical microphone structure is realized in a layer structure above a semiconductor substrate. In this case, the perforated counter element forms a pedestal-type projection in the component surface, and its size is adapted to the diaphragm disposed underneath. This diaphragm spans a sound opening in the substrate rear. An air gap, which was produced by sacrificial-layer etching, is situated between the counter element and the diaphragm. The rigidity of the counter element of the conventional microphone component depends to a large extent on its circumferential shape, i.e., on the form of the pedestal edge region, by which the counter element is set apart from the diaphragm.

For cost-related reasons, the production of such microphone components mostly uses a wafer composite if at all possible. Toward this end, a multitude of microphone structures disposed in grid form is usually produced on a semiconductor wafer. Only then are the components diced up. The highly fragile structure of the conventional microphone component, which is sensitive to water, poses a problem in this context. The cost-efficient sawing with the aid of a water-cooled circular saw, which is very common in micro technology, cannot be used for these components without additional protective measures. It must be assumed that the sensitive microphone structures are unable to withstand the impinging water jet. In addition, water that penetrates the space between the two electrodes of the microphone capacitor leads to irreversible adhesion of the diaphragm to the counter element, which also destroys the microphone function.

For this reason, micromechanical microphone components of the type mentioned above are currently separated using special processes. Stealth dicing, in which rupture joints are produced in the wafer material, is used particularly often. The wafer is then broken into individual chips along these rupture joints, sometimes with the aid of a blade. This requires special machinery and thus additional investment expense. Furthermore, the process times for the generally utilized wafers having a thickness of 400 μm to 800 μm are relatively long, due to the high number of required "laser cuts", among other things.

SUMMARY

In accordance with the present invention, a component having a robust but acoustically sensitive microphone structure is provided and a simple and cost-effective method for its production.

According to the present invention, this is achieved in that in contrast to the conventional microphone component described in U.S. Patent Application Publication No. 2002/0067663 A1, the additional layer in which the counter element is developed extends generally across the entire component surface and compensates for level differences, so that the entire component surface is largely level according to this additional further layer.

According to an example embodiment of the present invention, an advantageous effect on the rigidity of the counter element of the microphone structure comes about if the counter element is developed in a relatively thick layer, which extends across the entire component surface and compensates for differences in level. In this case, the counter element is integrated on all sides at the same rigidity, the rigidity essentially depending solely on the layer thickness. The thicker the layer, the stiffer the counter element, the more firmly the counter element is integrated in the layer configuration of the component and the better the leveling effect, especially in the edge region of the counter element.

According to an example embodiment of the present invention, the production of the microphone structure of the conventional component modified in this manner is easily implemented in a sequence of processes of bulk and surface micromechanics, as already used in the production of inertial sensors. The largely level component surface, in particular, simplifies the dice-up operation of the example microphone components according to the present invention, which will be explained in greater detail in connection with the production method according to the present invention.

There are various possibilities for implementing the microphone structure according to the present invention.

From the aspect of large-scale series production of microphone components having as many identical acoustic properties as possible, it is advantageous if the diaphragm layer of the example microphone component according to the present invention is realized in the form of a thin polysilicon layer, which is electrically insulated from the semiconductor substrate by a first insulation layer, and if the counter element is developed in a thick epi-polysilicon layer, which is electrically insulated from the diaphragm layer by a second insulation layer. The layer thickness of this second insulation layer defines the clearance between the diaphragm and the counter element. Standard methods known from bulk and surface micromechanics which offer excellent control are available for the production of such a layer structure featuring specified defined layer thicknesses.

However, the acoustic properties of the microphone component at issue here are not only defined by the clearance between the diaphragm and the counter element, but in particular also by the intrinsic stresses in the layer configuration and in the diaphragm. Uncontrolled stresses within the diaphragm can lead to an undesired predeflection of the diaphragm and thereby change the sensitivity-defining characteristics of the microphone capacitor. In one advantageous further development of the microphone component according to the present invention, a stress-relaxing spring suspension for the diaphragm is therefore developed in the diaphragm layer. In this case the spring elements are thus made of the same material as the diaphragm and, if possible, are designed such that they provide compensation for the layer stresses which arise in the production of the thin polysilicon layer and are difficult to control. Due to this compensation of layer stresses, the diaphragm's sensitivity to sound pressure is generally defined solely by its flexural stiffness. The spring suspension of the diaphragm also contributes to the maximization of the useful signal of the microphone because a deformation due to sound pressure preferably occurs in the region of the spring elements, whereas the diaphragm contributing to the measuring capacity is deflected virtually in plane-parallel manner in relation to the counter electrode. The influence of parasitic capacitances arising in the connection region of the diaphragm is relatively low due to the recesses between the spring elements. For this reason, the resonant frequency of the diaphragm and thus the acoustic working range of the microphone component according to the present invention is adjustable in well-controlled manner via the design of the spring suspension, in conjunction with a layer thickness of the diaphragm that is definable in advance.

The spring suspension advantageously encompasses at least three spring elements. The fixed points of these spring elements may be embedded between the first and second insulation layers and thereby be connected to the semiconductor substrate and the counter element. As an alternative, however, the spring elements may also be connected only via one of the two insulation layers, either to the semiconductor substrate or to the counter element.

As mentioned above, in addition to the afore-described microphone component, an especially advantageous method for the production of such components is provided as well. Accordingly, to begin with, a first electrically insulating sacrificial layer is deposited on a semiconductor substrate. Then, a diaphragm layer is deposited on this first sacrificial layer and patterned in order to produce at least one diaphragm having a spring suspension for one component in each case. Subsequently, a second, electrically insulating sacrificial layer is deposited on the patterned diaphragm layer, on which at least one further layer is then deposited and patterned, in order to produce an individual acoustically permeable counter element for each diaphragm. In addition, at least one sound opening is produced on the rear side of the semiconductor substrate, underneath each diaphragm. The first sacrificial layer and the second sacrificial layer are then removed at least in the region underneath and above each diaphragm and its spring suspension. The components are finally diced up only after the microphone structures have been exposed.

A thin polysilicon layer is advantageously deposited on the first sacrificial layer as diaphragm layer. Furthermore, it is advantageous if a thick epi-polysilicon layer is grown on the second sacrificial layer as a further layer, in which the counter elements are developed.

The process sequence of this method variant for producing a microphone component is similar to that of a tried and tested method for producing inertial sensors that offers excellent control. For example, the polysilicon layer functioning as diaphragm layer according to the present invention is used for realizing buried conductor traces when inertial sensors are produced. And the thick epi-polysilicon layer, in which the counter elements are realized according to the present invention, serves as functional layer if inertial sensors are produced.

The first and the second electrically insulating sacrificial layers, for one, assume the role of an electrical insulation between the two electrodes of the microphone capacitor and with respect to the semiconductor substrate. For another, the diaphragms are exposed with the aid of the sacrificial layers. In the framework of the example method according to the present invention, these sacrificial layers may additionally assume the function of an etch-stop boundary. For example, the second sacrificial layer advantageously acts as etch stop in the patterning of the counter element or the thick epi-polysilicon layer, provided this takes place in an anisotropic etching process, especially a trench process or a DRIE process. The first sacrificial layer advantageously acts as etch stop in the production of the sound openings in an anisotropic etching process, especially a DRIE process.

To expose the diaphragms, the first sacrificial layer and the second sacrificial layer are advantageously removed in an isotropic etching process, the etching attack being performed via the sound openings and via through holes in the counter elements. $SiO_2$ or SiGe are especially suitable as materials for the sacrificial layer.

The use of a SiGe sacrificial layer using $ClF_3$ as etching gas is especially advantageous due to the high selectivity of the etching process with regard to numerous materials used in micro-system technology, and with regard to silicon, in particular. This etching process is characterized by its high etching speed and the large under-etching widths obtainable in this manner. In addition, SiGe sacrificial layers are especially low in stresses, so that the use of this material also allows relatively thick sacrificial layers and thus large electrode clearances to be realized, without introducing additional stresses in the component configuration. This increases the design freedom in the configuration of the microphone component.

As mentioned already, the microphone structures according to the present invention are exposed in the wafer composite and separated only thereafter. One especially advantageous variant of the method according to the present invention utilizes the configuration of the microphone component according to the present invention, i.e., the fact that the layer in which the counter elements are realized is situated on the top surface of the layer configuration and that this layer is relatively thick as well as stable, and mostly planar according to the present invention. These layer properties allow a protective foil to be applied, which reliably prevents particles and fluid from entering the microphone structures. As a result, the microphone components are able to be diced up in a sawing process standardized in micromechanics, which yields enormous cost advantages in comparison with the methods currently used for dicing up microphone components. Following the dice-up procedure, the protective foil is removed, leaving as little residue as possible.

In this context, it is advantageous to use a protective foil which loses its adhesive strength through UV radiation or a thermal treatment or through UV radiation in combination with a thermal treatment. Such a protective foil is easily able to be laminated to the largely planar surface of the layer configuration, using a vacuum, and to be detached again from the surfaces of the components following the dice-up process with the aid of UV radiation in combination with a thermal treatment, leaving no residue and causing no damage to the microphone structures.

BRIEF DESCRIPTION OF THE DRAWINGS

As discussed above, there are various possibilities for realizing and further developing the teaching of the present invention in an advantageous manner. In this regard, reference is made to the following description of several exemplary embodiments of the present invention with reference to the figures.

DETAILED DESCRIPTION OF EXAMPLE EMBODIMENTS

Figure 1:
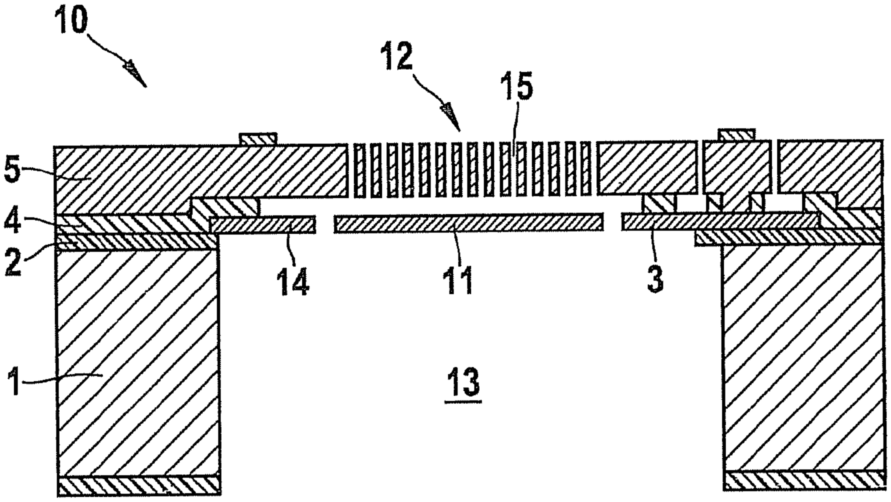
FIG. 1 shows a schematic sectional view of the example microphone structure of a component 10 according to the present invention.

Component 10 shown in FIG. 1 includes a micromechanical microphone structure having a deflectable, acoustically active diaphragm 11, and a stationary, acoustically permeable counter element 12, which is also referred to as back plate. Here, diaphragm 11 and counter element 12 are realized in a layer configuration on a semiconductor substrate 1. A sound opening 13, which extends across the entire thickness of semiconductor substrate 1 and which is spanned by diaphragm 11 disposed on the top side of semiconductor substrate 1, is developed on the rear side of semiconductor substrate 1. Diaphragm 11 is realized in a thin polysilicon layer 3 and electrically insulated from semiconductor substrate 1 by a first insulation layer 2. The deflectability of thin diaphragm 11 is enhanced by its spring suspension 14 formed in polysilicon layer 3. In contrast, counter element 12 is developed in a relatively thick epi-polysilicon layer 5 above diaphragm 11 and fixedly connected to the layer configuration. With the aid of a second insulation layer 4, counter element 12 is electrically insulated from diaphragm 11 and also from semiconductor substrate 1. The thickness of this second insulation layer 4 also defines the clearance between diaphragm 11 and counter element 12 in the neutral state. Through openings 15 are developed in the center region of counter element 12, so that counter element 12 is acoustically permeable and does not have an adverse effect on the sound-related deflections of diaphragm 11.

Diaphragm 11 and counter element 12 form the electrodes of a microphone capacitor whose capacitance varies with the clearance between diaphragm 11 and counter element 12. To detect the capacitance changes of the microphone capacitor, a charging voltage, which is also referred to as bias voltage, is applied between diaphragm 11 and counter electrode 12. The arrangements for detecting and analyzing the capacitance changes of the microphone capacitor are not shown here in detail.

According to an example embodiment of the present invention, epi-polysilicon layer 5 in which counter element 12 is developed extends across the entire component surface and compensates for differences in level, so that the entire component surface is largely planar in accordance with this epi-polysilicon layer 5. This may be advantageous especially in connection with the dice-up operation of these components, which will once again be explained in greater detail in connection with FIGS. 4*a* through 4*f*.

Figure 2A:
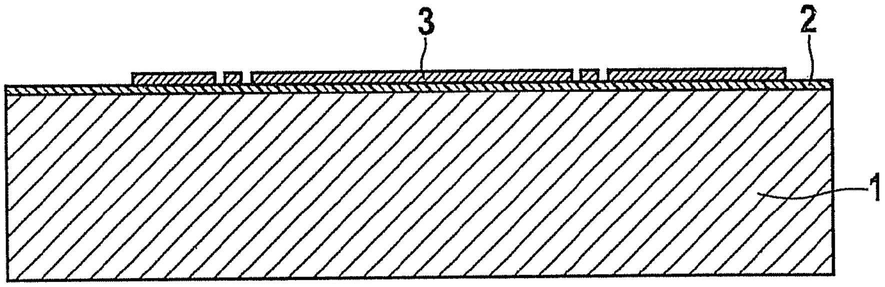
FIG. 2*a* through 2*f* illustrate the example method for producing the microphone structure according to the present invention shown FIG. 1 with the aid of schematic sectional representations of the layer configuration.

One especially advantageous method variant for producing the microphone structure of component 10 illustrated in FIG. 1 is described below in connection with FIGS. 2*a* through 2*f*. The starting point of this example method is a semiconductor substrate 1, e.g., in the form of a silicon wafer as shown in FIG. 2*a*. In a first method step, a first electrically insulating sacrificial layer 2 is deposited on the wafer front. This may be an $SiO_2$ layer or also an SiGe layer. A diaphragm layer 3 was then deposited above first sacrificial layer 2 and patterned, in order to produce at least one diaphragm featuring a spring suspension for each individual component. One example of such a diaphragm structure is shown in FIG. 3 and shall be discussed in greater detail in connection with this figure. In the exemplary embodiment described here, diaphragm layer 3 is a polysilicon layer whose layer thickness lies between 0.1 μm and 3 μm, depending on the requirements.

Figure 2B:
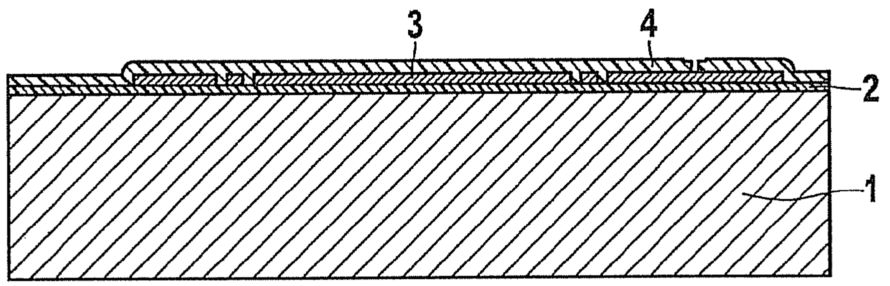
Figure 3:
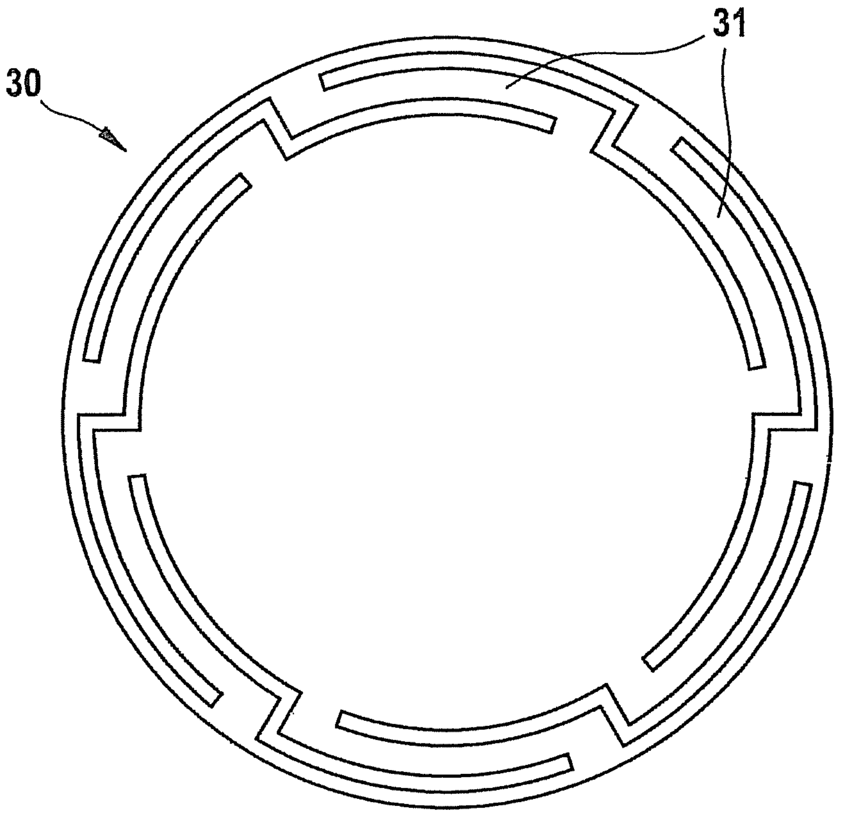
FIG. 3 shows the plan view of a circular diaphragm having a spring suspension of a microphone component according to the present invention.

FIG. 2*b* shows the layer configuration after a second electrically insulating sacrificial layer 4 has been deposited on patterned diaphragm layer 3 and patterned. In this case, the electrical contacting of the microphone structure was prepared via the patterning of the second sacrificial layer. In an advantageous manner, the same material has been selected for both sacrificial layers 2 and 4, which is then able to be removed from the front and rear sides of the diaphragms in a shared etching operation during a later process stage.

Figure 2C:
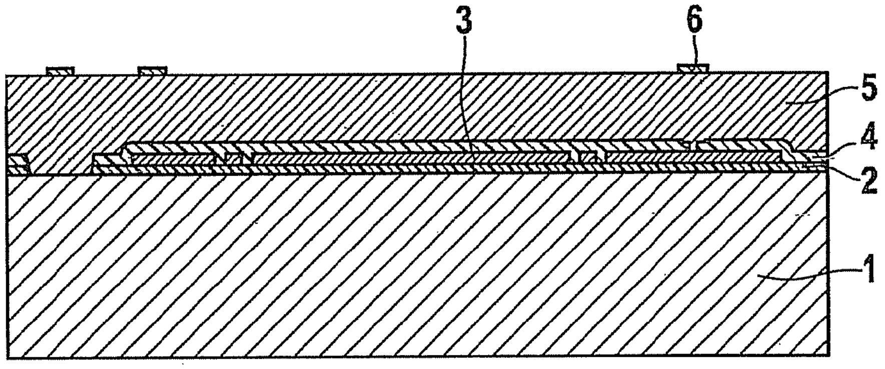

A thick epi-polysilicon layer 5 was subsequently produced on second sacrificial layer 4, which is shown in FIG. 2*c*. For this purpose, the layer material is epitaxially grown from the vapor phase, advantageously beginning with a starting layer of thin LPCVD polysilicon. Depending on the requirements for the microphone component, the thickness of an epi-polysilicon layer 5 produced in this manner may lie in a range between 3 μm and 20 μm. FIG. 2*c* shows that the layer configuration has been leveled with the aid of epi-polysilicon layer 5, which is facilitated by the deposition method in conjunction with the relatively great layer thickness. The planar top surface of epi-polysilicon layer 5 was then provided with a patterned metallic coating 6, which is likewise used for contacting the individual components of the microphone structures. However, such a metallic coating may also be deposited on the layer configuration at a later stage in the production process.

Figure 2D:
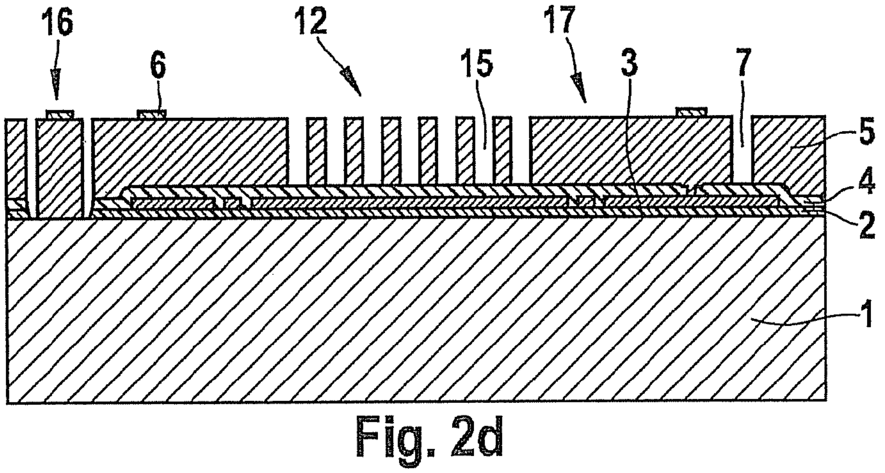

FIG. 2*d* shows the layer configuration after epi-polysilicon layer 5 has been patterned in an anisotropic trench process or in a DRIE process. In so doing, second sacrificial layer 4 was used as etch-stop boundary. Within the scope of this patterning, counter elements 12 of the microphone structures are exposed within epi-polysilicon layer 5 and provided with through openings 15. Trenches 7 not only define but also electrically decouple individual areas of epi-polysilicon layer 5. For example, contact regions 16 and 17 for substrate 1 and the diaphragms were defined in the patterning of the epi-polysilicon layer as well.

Figure 2E:
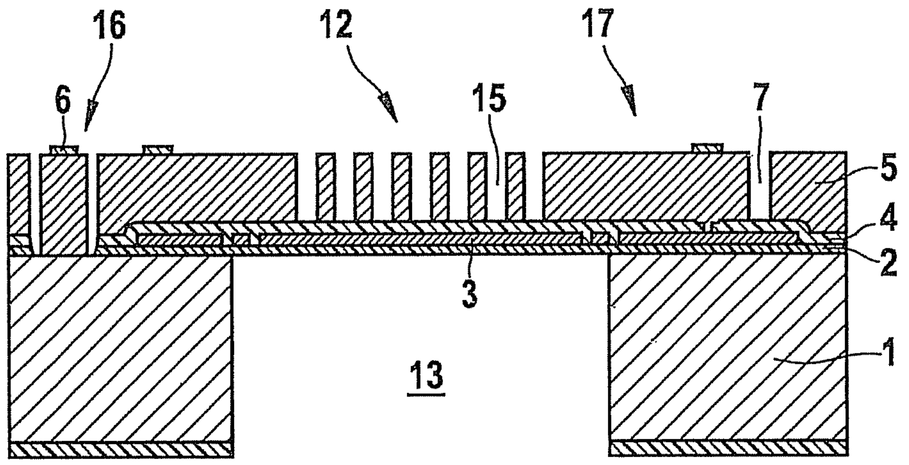

Afterwards, in an anisotropic DRIE process starting from the substrate rear side in the exemplary embodiment shown, sound openings 13 were produced in an anisotropic DRIE process, which is illustrated in FIG. 2*e*. Sacrificial layer 2 forms the etch-stop boundary for this rear-side etching process, which may just as well be implemented prior to patterning epi-polysilicon layer 5.

Figure 2F:
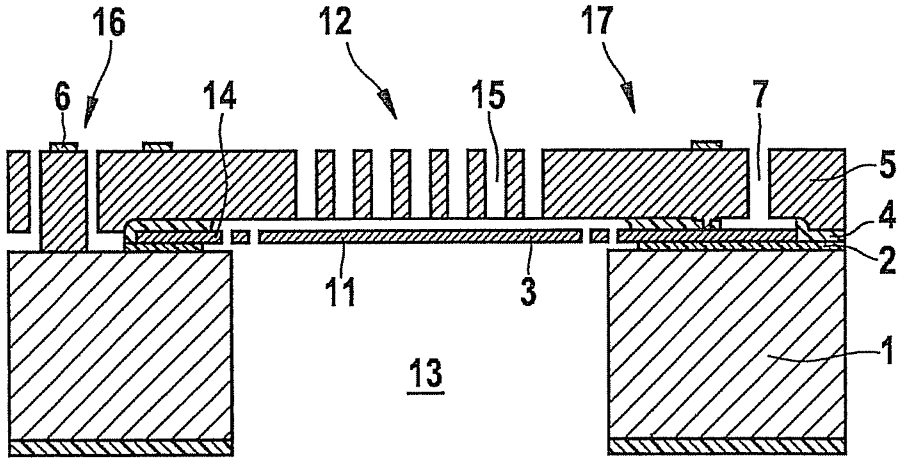

Finally, using isotropic sacrificial-layer etching, diaphragms 11 of the microphone structures and the associated spring suspensions 14 were exposed. The required etching attack took place from both sides of the layer configuration simultaneously. In the process, the etching gas reached sacrificial layer 4 from the front side via trenches 7 and through openings 15, and sacrificial layer 2 from the rear side via sound openings 13. In case of $SiO_2$ sacrificial layers, the material of the sacrificial layer is preferably dissolved out using HF vapor. In case of SiGe sacrificial layers, $ClF_3$ is used as etching gas. FIG. 2*f* shows the microphone structure illustrated in FIG. 1 as the result of this etching process and makes it clear that the clearance between diaphragm 11 and counter element 12 is defined by the layer thickness of sacrificial layer 4.

According to the method described above, the diaphragms of the microphone elements of the present invention together with their spring suspensions are realized in a thin polysilicon layer. The spring elements of the individual diaphragms are preferably developed in such a way that the diaphragms are largely suspended independently of the layer stress of the diaphragm material. FIG. 3 shows an advantageous layout of the spring suspension of a circular diaphragm 30. Diaphragm 30 is suspended by a total of six spring elements 31. Spring elements 31 are realized in the form of curved segments, which are situated along the diaphragm periphery and extend over one sixth of the diaphragm circumference in each case. One end of each spring element 31 is connected to diaphragm 30, while the other end is integrated into the surrounding edge region of the layer configuration. For this purpose, these ends of spring elements 31 may be embedded between the two sacrificial layers such that they are connected both to the counter element and to the substrate. As an alternative, however, these spring ends may also be connected, to the counter element or the substrate on one side only. The spring suspension shown here is developed in such a way that it is able to compensate, at least within certain limits, for the difficult to control layer stresses arising in the production of the polysilicon diaphragm layer, both when the polysilicon has been deposited in tensile manner and also when it has been deposited in compressive manner.

Diaphragm 30 illustrated here is suspended in stable manner via spring elements 31. The deformation in response to the application of pressure mainly takes place in the region of spring elements 31. This deflects the diaphragm surface, which is decisive for the microphone function and functions as movable electrode, in approximately plan-parallel manner relative to the counter element, which has an advantageous effect on the useful signal of the microphone.

In the exemplary embodiment described here, a simple electronics function is provided as overload protection for the microphone structure. The evaluation electronics automatically detect if the diaphragm strikes the counter element, which may occur in overload cases, e.g., at very high sound pressures or under the influence of shock. In order to release the electrostatic adhesive forces that occur in the process and to avoid permanent electrostatically induced adhesion of the diaphragm to the counter element, the bias voltage is temporarily interrupted. In the voltage-free state, the diaphragm then is able to detach itself from the counter element again. This concept is especially suitable for bias voltages below 5 V, since no electrical welding between diaphragm and counter element is able to take place at these low bias voltages.

As described in connection with FIGS. 2*a* through 2*f*, the production of the microphone structures according to the present invention, including exposure of the diaphragm, takes place in the wafer composite. In the following text, an especially advantageous dice-up method for these microphone structures will be described in connection with FIGS. 4*a* through 4*f*.

Figure 4A:
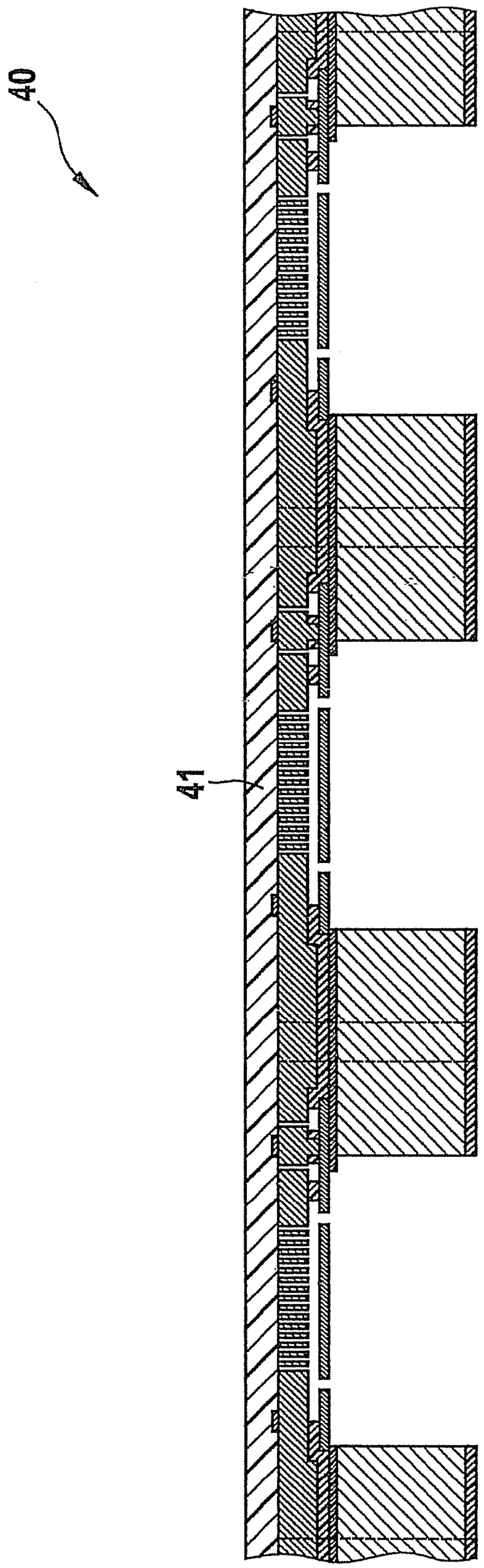
FIGS. 4*a* to 4*e* illustrate the dicing-up process of microphone structures produced in a wafer composite, using schematic sectional views.

First, as shown in FIG. 4*a*, a protective foil 41 having special adhesive properties is applied on the surface of layer configuration 40, which is largely planar according to the present invention, using a vacuum lamination device. This protective foil 41 loses its adhesive strength under the action of UV light in combination with heat, which makes is easy to remove protective foil 41 following the dice-up process without leaving any residue.

Figure 4B:
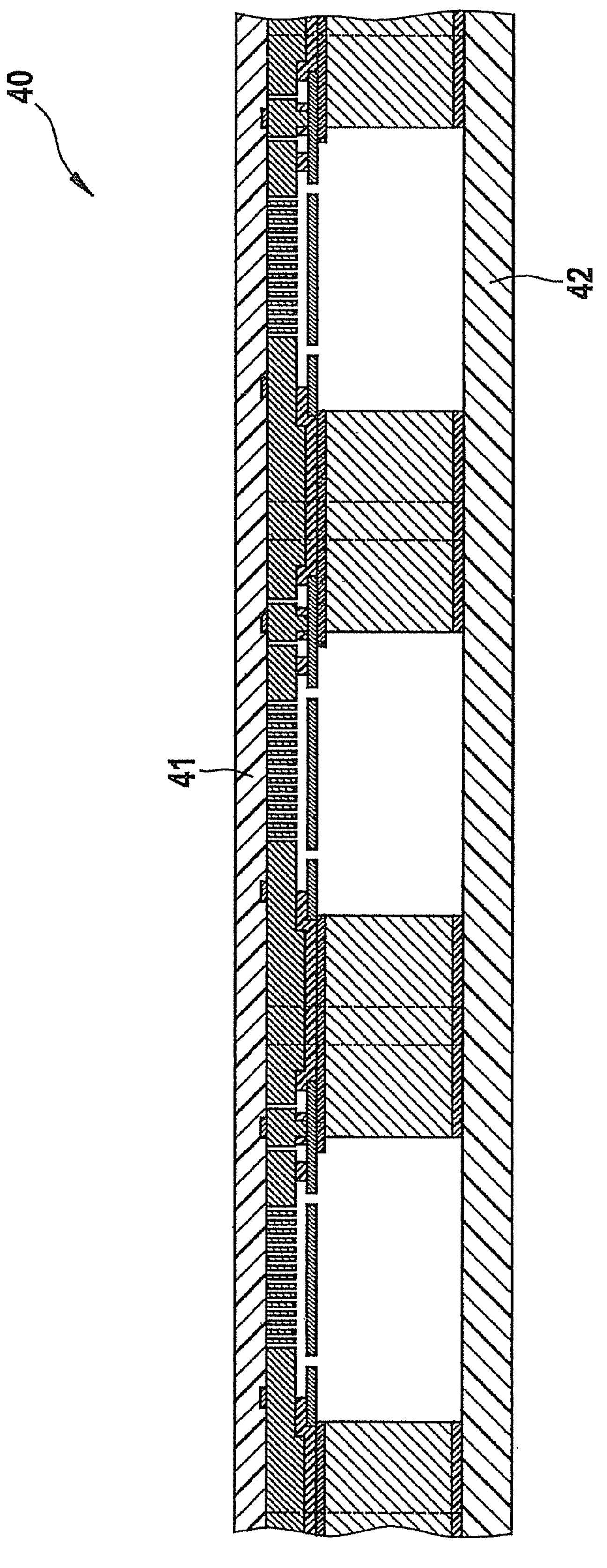

FIG. 4*b* shows layer configuration 40 with protective foil 41 after it has been bonded to a saw frame, which is covered by a saw foil 42. Saw foil 42 must be heat-resistant, at least to the extent that it is resistant to temperatures at which protective foil 41 loses its adhesive strength. Furthermore, the adhesive strength of protective foil 41 and the adhesive strength of saw foil 42 must be high enough to allow chips having a chip dimension of 1×1 $mm^2$, for example, to adhere during a sawing process.

Figure 4C:
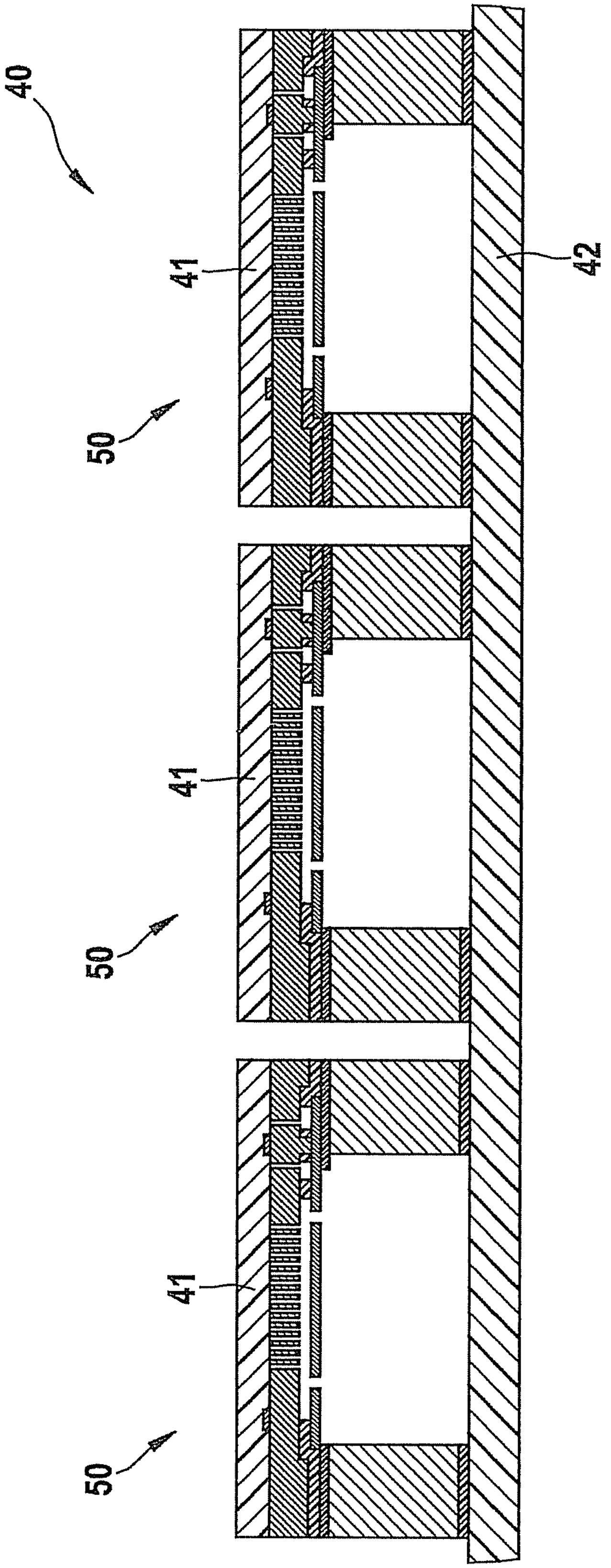

Since layer configuration 40 and, in particular, the microphone structures exposed in layer configuration 40 are protected by protective foil 41, layer configuration 40 is now able to be cut up with the aid of a water-cooled circular saw. In the process, protective foil 41 effectively prevents the entry of water or saw particles into the microphone structures. In FIG. 4*c*, layer configuration 40 having protective foil 41 has already been cut up. However, individual components 50 still adhere to cohesive saw foil 42.

Figure 4D:
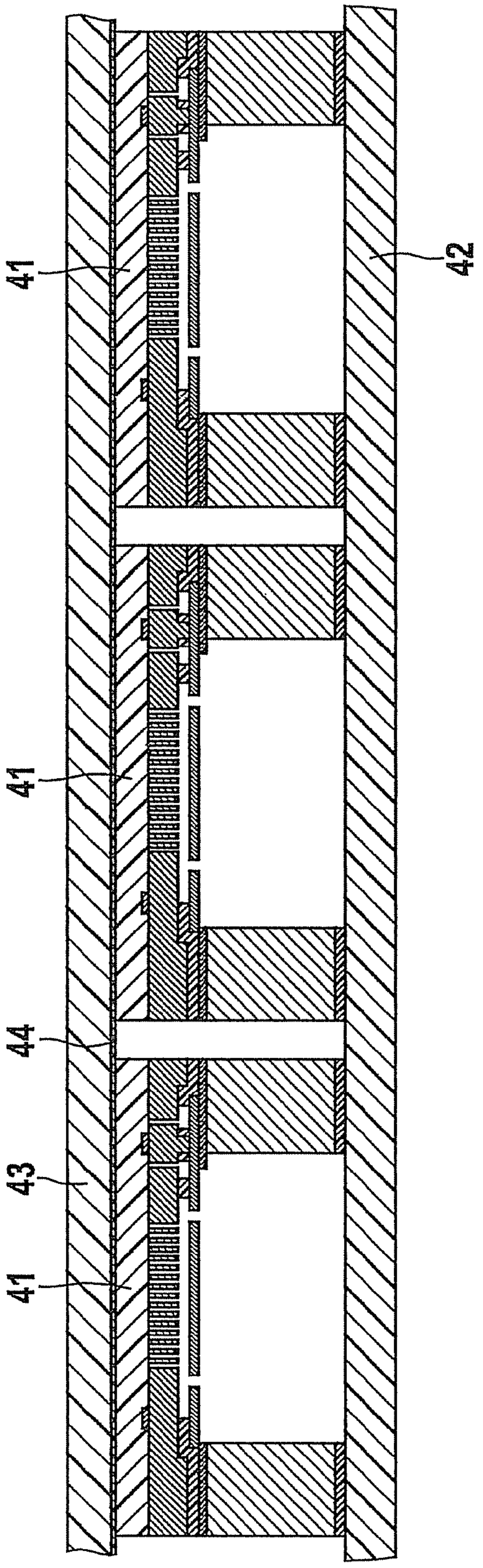
Figure 4E:
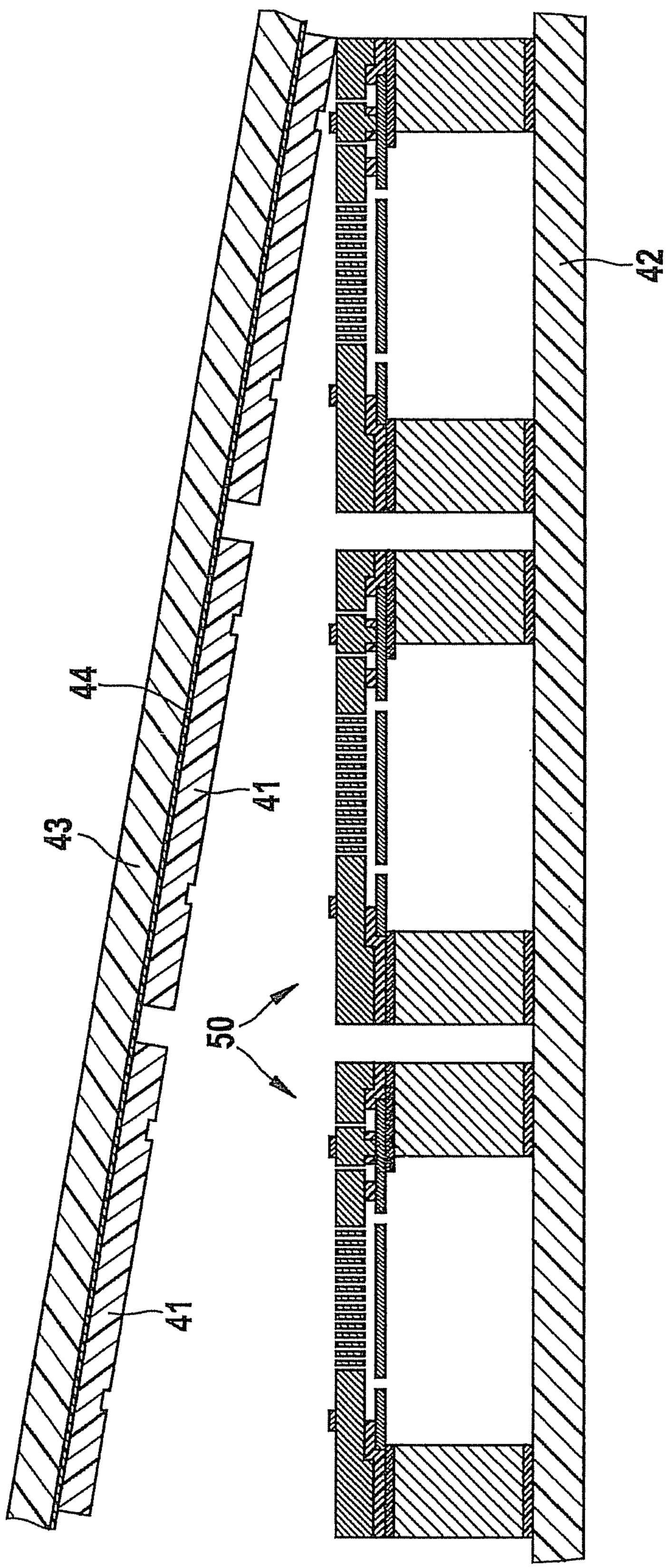

Following the sawing operation, protective foil 41 may be removed from the top surface of individual components 50. For this purpose, the foil is first exposed to UV radiation. This is followed by a thermal treatment, during which laminated protective foil 41 completely detaches from the top surface of the components. Following the thermal treatment, foil pieces, which must be aspirated or blown off, are therefore present on each component 50. In the exemplary embodiment described here, the foil pieces are picked up using a stamping method, which is illustrated in FIGS. 4*d* and 4*e*. A second wafer 43 is used for this purpose, on whose stamp surface a bilaterally adhesive foil 44, a soft polymer layer or a soft resist layer has been applied.

Figure 4F:
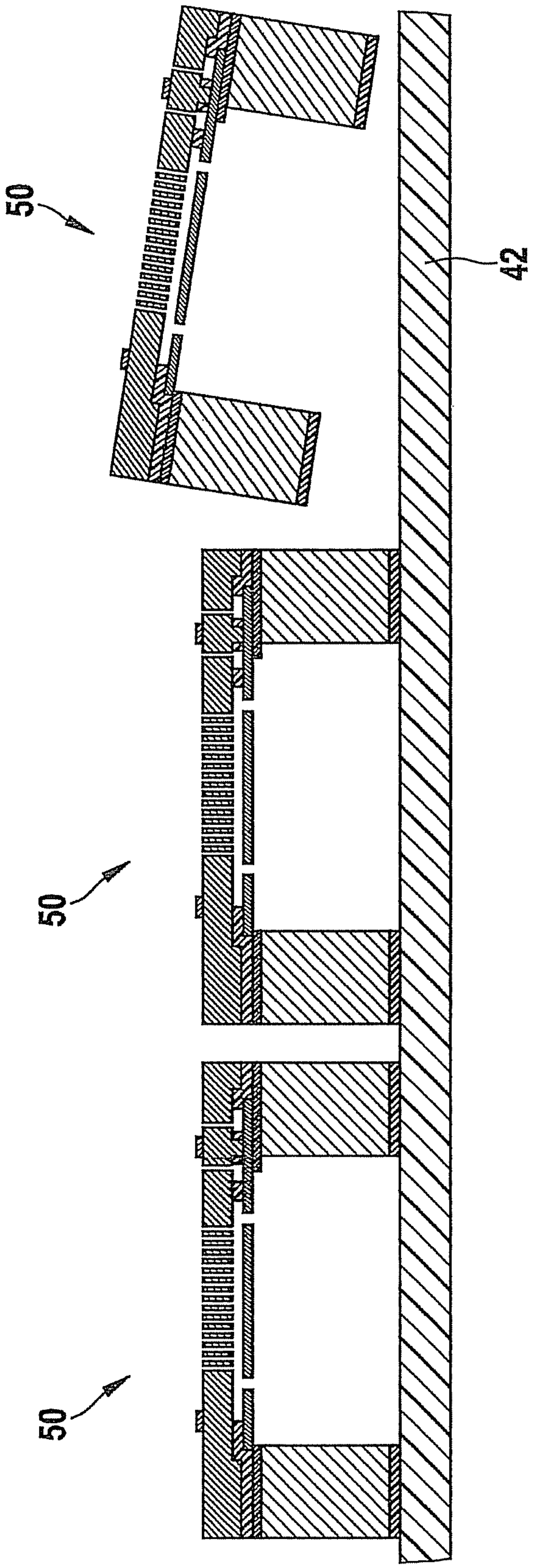

Subsequently, saw foil 42 may be expanded, and individual components 50 may be picked off from saw foil 42 using pick-and-place tools, and then packaged, which is illustrated by FIG. 4*f*.

The microphone structure according to the present invention, having a largely planar component surface, makes it possible to mount a protective foil on the top surface of the wafer composite. As a result, the microphone elements according to the present invention are able to be diced up in a standard sawing process; the additional process work caused by the application and removal of a second foil is negligible. Since protective foil 41 itself is also relatively inexpensive, its use within the scope of the dice-up process contributes only slightly to the total cost of an individual component.

What is claimed is:

1. A method for manufacturing micromechanical microphone components, comprising:

depositing a first electrically insulating sacrificial layer on a semiconductor substrate;

depositing a diaphragm layer on the first sacrificial layer and patterning the diaphragm layer to produce at least one diaphragm having a spring suspension for each of the components;

depositing a second electrically insulating sacrificial layer on the patterned diaphragm layer;

depositing at least one additional layer on the second sacrificial layer and patterning to produce for each diaphragm an acoustically permeable counter element;

producing at least one sound opening under each diaphragm in a rear side of the semiconductor substrate;

removing the first sacrificial layer and the second sacrificial layer at least in a region underneath and above each individual diaphragm and spring suspensions of the diaphragms;

dicing up the components only after microphone structures have been exposed;

wherein following the exposure of the microphone structures, a protective foil is deposited on layers above the semiconductor substrate, which prevents entry of particles and fluid into the microphone structures, and the protective foil is removed from the component surface after the components have been diced up, without leaving any residue.

2. The method as recited in claim 1, wherein a thin polysilicon layer is deposited as the diaphragm layer on the first sacrificial layer, and a thick epi-polysilicon layer in which the counter elements are developed is grown on the second sacrificial layer.

3. The method as recited in claim 2, wherein the epi-polysilicon layer is patterned in an anisotropic etching process, the second sacrificial layer functioning as etch stop.

4. The method as recited in claim 3, wherein the anisotropic etching process is one of a trench process or a DRIE process.

5. The method as recited in claim 1, wherein the sound openings are produced in an anisotropic etching process, the first sacrificial layer functioning as etch stop.

6. The method as recited in claim 5, wherein the anisotropic etching process is a DRIE process.

7. The method as recited in claim 1, wherein the first sacrificial layer and the second sacrificial layer are removed in an isotropic etching process, an etch attack taking place via the sound opening and via through openings in the counter elements.

8. The method as recited in claim 1, wherein at least one of the first sacrificial layer and the second sacrificial layer is formed from one of $SiO_2$ or SiGe.

9. The method as recited in claim 1, wherein the protective foil loses its adhesive force by one of UV radiation, a thermal treatment, or by UV radiation in combination with a thermal treatment.

10. The method as recited in claim 9, wherein the protective foil is laminated onto a largely planar surface of the layers under a vacuum, and is removed from the component surfaces after the dice-up process, by UV radiation in combination with a thermal treatment.

11. The method as recited in claim 1, wherein the components are diced up in a standard sawing process.

* * * * *